US011310919B2

(12) United States Patent
Pohley et al.

(10) Patent No.: US 11,310,919 B2
(45) Date of Patent: Apr. 19, 2022

(54) METHOD FOR PRODUCING A CONNECTION CONTACT

(71) Applicant: Knorr-Bremse Systeme Fuer Nutzfahrzeuge GmbH, Munich (DE)

(72) Inventors: Karin Pohley, Nuremberg (DE); Markus Deeg, Eberdingen (DE); Julian Soehnlein, Schwieberdingen (DE); Andreas Eisenberger, Nuertingen (DE); Maximilian Wenner, Benningen (DE); Georg Wagner, Karlsruhe (DE); Mikail Sinemli, Ludwigsburg (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 22 days.

(21) Appl. No.: 17/052,217

(22) PCT Filed: Apr. 30, 2019

(86) PCT No.: PCT/EP2019/061032
§ 371 (c)(1),
(2) Date: Nov. 2, 2020

(87) PCT Pub. No.: WO2019/211271
PCT Pub. Date: Nov. 7, 2019

(65) Prior Publication Data
US 2021/0410293 A1 Dec. 30, 2021

(30) Foreign Application Priority Data
May 4, 2018 (DE) .......................... 102018110752.8

(51) Int. Cl.
*H01R 43/02* (2006.01)
*H05K 3/34* (2006.01)
(Continued)

(52) U.S. Cl.
CPC .......... *H05K 3/3447* (2013.01); *H01R 12/58* (2013.01); *H01R 43/0256* (2013.01); *H05K 1/115* (2013.01)

(58) Field of Classification Search
CPC ...... H05K 3/3447; H05K 1/115; H01R 12/58; H01R 43/0256
(Continued)

(56) References Cited

U.S. PATENT DOCUMENTS 3,927,925 A * 12/1975 Borsuk ................ H01R 12/523
439/109
4,097,101 A 6/1978 Holt et al.
(Continued)

FOREIGN PATENT DOCUMENTS

DE 3215320 A1 10/1983
DE 19829920 A1 5/1999
(Continued)

OTHER PUBLICATIONS

International Search Report dated Jul. 23, 2019 for PCT/EP2019/061032.

*Primary Examiner* — Sherman Ng
(74) *Attorney, Agent, or Firm* — Norton Rose Fulbright US LLP; Gerard Messina; Aaron Deditch

(57) ABSTRACT

A method for producing a connection contact for a sensor or an actuator of a vehicle, the method including: providing a printed circuit board having at least one electronic component arranged thereon and having an opening; inserting a contact bushing into the opening; and combined soldering the at least one component to the printed circuit board and the contact bushing to the printed circuit board in one task. Also described are a related circuit board and a vehicle control unit.

10 Claims, 3 Drawing Sheets

(51) Int. Cl.
*H01R 12/58* (2011.01)
*H05K 1/11* (2006.01)

(58) Field of Classification Search
USPC .......................................................... 174/262
See application file for complete search history.

(56) References Cited

U.S. PATENT DOCUMENTS

| | | | |
|---|---|---|---|
| 4,296,993 | A | 10/1981 | Wellington |
| 5,362,244 | A | 11/1994 | Hanson et al. |
| 6,084,296 | A * | 7/2000 | Colello ................ H05K 1/0209 257/687 |
| 2002/0062986 | A1* | 5/2002 | Lopp .................... H01H 1/5805 174/250 |
| 2004/0251231 | A1* | 12/2004 | Takahira ................ H05K 3/306 216/13 |
| 2012/0235206 | A1* | 9/2012 | Kampfrath ............ H05K 3/325 257/99 |
| 2016/0268716 | A1 | 9/2016 | Conger et al. |

FOREIGN PATENT DOCUMENTS

| | | |
|---|---|---|
| JP | S5364766 A | 6/1978 |
| JP | H02299290 A | 12/1990 |
| JP | 3104494 U | 9/1994 |

\* cited by examiner

METHOD FOR PRODUCING A CONNECTION CONTACT

FIELD OF THE INVENTION

The present invention relates to a method for producing a connection contact on a printed circuit board and in particular relates to a contacting arrangement of an actuator or sensor in commercial vehicles by way of contact bushings that are configured on the printed circuit board by means of a reflow soldering process.

BACKGROUND INFORMATION

In the automotive industry, components such as sensors, actuators are electrically contacted by way of a printed circuit board, wherein electronic components such as corresponding evaluation or control circuits are provided on the printed circuit board in order for example to read out sensor data or control the actuators (e.g. solenoid valves) or provide other functions. It has hitherto been usual for this purpose that the components are initially soldered onto the printed circuit boards. A contact guide strip embodied from a synthetic material is subsequently attached to the printed circuit board and afterwards the locking means is soldered to the printed circuit board by means of a selective soldering process, wherein the guide strip comprises an insertion funnel and a fixing arrangement for corresponding contact pins to the sensors or the actuators. Since these contact strips are embodied from synthetic material, they are only soldered separately/selectively.

It has therefore hitherto been necessary to perform two separate working steps in order to provide connection contacts for sensors and actuators on printed circuit boards and there is a need to configure the contacting arrangement in a more simple and efficient manner.

SUMMARY OF THE INVENTION

At least one part of the mentioned problems is solved by a method as described herein, a printed circuit board as described herein, and a vehicle control unit as described herein. Further advantageous embodiments are described herein as to the method as described herein or of the printed circuit board as described herein.

The present invention relates to a method for producing a connection contact that is suitable for electrically contacting a sensor or an actuator (or similar components) of a motor vehicle. The method comprises: providing a printed circuit board having at least one electronic component arranged thereon and having (at least) one opening, inserting a contact bushing into the opening and combined soldering the at least one component to the printed circuit board and the contact bushing to the printed circuit board in one method step. The actuator can be for example a controllable valve (e.g. solenoid valve). The combined soldering process is in particular a reflow soldering process.

Optionally, the step of inserting the contact bushing is performed by means of a placement machine and the inserted contact bushing comprises locking means for a contact pin so as to contact the sensor or the actuator. For example, the locking means can be configured in the inserted contact bushing in order to hold the contact pin by means of press-in technology (e.g. by means of a press-fit contact). It is possible for this purpose to provide resilient fingers that provide a reliable electrical contact.

Optionally, the contact bushing is inserted by means of the insertion machine that grips the contact bushing by means of using a vacuum and inserting the contact bushing into the opening. For example, the contact bushing can have a through-going opening for a contact pin that comprises a temporary covering (e.g. embodied from paper) so that the contact bushing can be gripped by means of a vacuum. Optionally, the temporary covering is removed after the combined soldering process. The term "temporary" is to be understood to be broad and in particular to include any covering that can be mechanically removed (e.g. pulled off and punched through) without damaging the printed circuit board and/or the connection bushing and/or the solder connection.

Optionally, in the providing step a printed circuit board is provided that has on both sides or on one side soldering means at the opening. The soldering means can be embodied for example in the form of pads around the opening and melts during the exemplary reflow soldering process.

The present invention also relates to a printed circuit board having a connection contact for a sensor or for an actuator in a vehicle. The printed circuit board comprises a contact bushing having a through-going opening that is configured in order to receive a contact pin that contacts the sensor or the actuator of the vehicle and to provide an electrical contact. Furthermore, the printed circuit board comprises reflow solder connections between the contact bushing and a metallization on the printed circuit board and further reflow solder connections between one or more components and the printed circuit board.

Optionally, the contact bushing comprises a through-going opening having a temporary covering, in particular embodied from a paper material, wherein the temporary covering is embodied so as to be gripped by a placement machine by means of a vacuum. It goes without saying that the through-going opening only has a through-going opening after the temporary cover has been removed with the result that a contact pin can extend through the contact bushing.

The present invention also relates to a vehicle control unit having a previously defined printed circuit board, a sensor or an actuator and at least one contact pin that provides an electrical connection between the printed circuit board and the sensor or the actuator.

The vehicle can be in particular a commercial vehicle.

The reflow soldering process is a known technology for providing electrical contact. In this case, initially the solder material is provided on the printed circuit board, for example in the form of a contact pad. Subsequently, electronic components and the connection bushing are placed on the printed circuit board. During the subsequent soldering process, a heating process is performed (for example in an oven), wherein the solder material melts and the electrical connection is produced between the printed circuit board and the components that are arranged on the surface or to the inserted connection bushing. It is possible in this manner to produce the electrical connections to all the components on the printed circuit board and to the connection bushing in one step. After the soldering process, the printed circuit board can be screwed to the vehicle in the desired position, wherein simultaneously the contact pins can be inserted into the connection bushings and fixed there by way of a resilient fit.

It goes without saying that a person skilled in the art is able to clearly recognize a solder connection that has been produced using a reflow soldering process. For example, it is possible to recognize that the (combined) reflow soldering process has been used on the produced printed circuit board residue by virtue of the fact that residual pieces of solder pads that are configured for a reflow soldering process are left on the printed circuit board. Furthermore, the solder seam of a conventional soldering method differs from the solder seam of a reflow soldering process.

Exemplary embodiments of the present invention offer a series of advantages. For example, the number of working steps required in order to produce a contact connection for sensors/actuators is minimized. A guide strip is thus no longer required. In lieu of a guide strip, a contact bushing is used that can be soldered together to the electronic compounds that are to be configured on the printed circuit board. This is performed by means of a combined soldering process (e.g. by means of a reflow soldering process) with the result that subsequently not only the components are soldered to the printed circuit board but rather likewise the contact bushing. As a consequence, it is not necessary to perform an additional subsequent soldering process. The printed circuit board can furthermore be equipped with the contact bushing automatically by way of a placement machine. A further advantage of exemplary embodiments is the possible printed circuit board design that requires only very little space for the contact connection to the sensor/actuator (e.g. a layout with few restricted zones). Likewise, the costs with respect to the known series solution using a synthetic strip are greatly reduced by means of the exemplary embodiments.

The exemplary embodiments of the present invention are better understood from the following detailed description and the attached drawings of the different exemplary embodiments that should however not be understood to imply that they limit the disclosure to the specific embodiments but rather serve merely to explain and understand the present invention.

DETAILED DESCRIPTION

Figure 1:
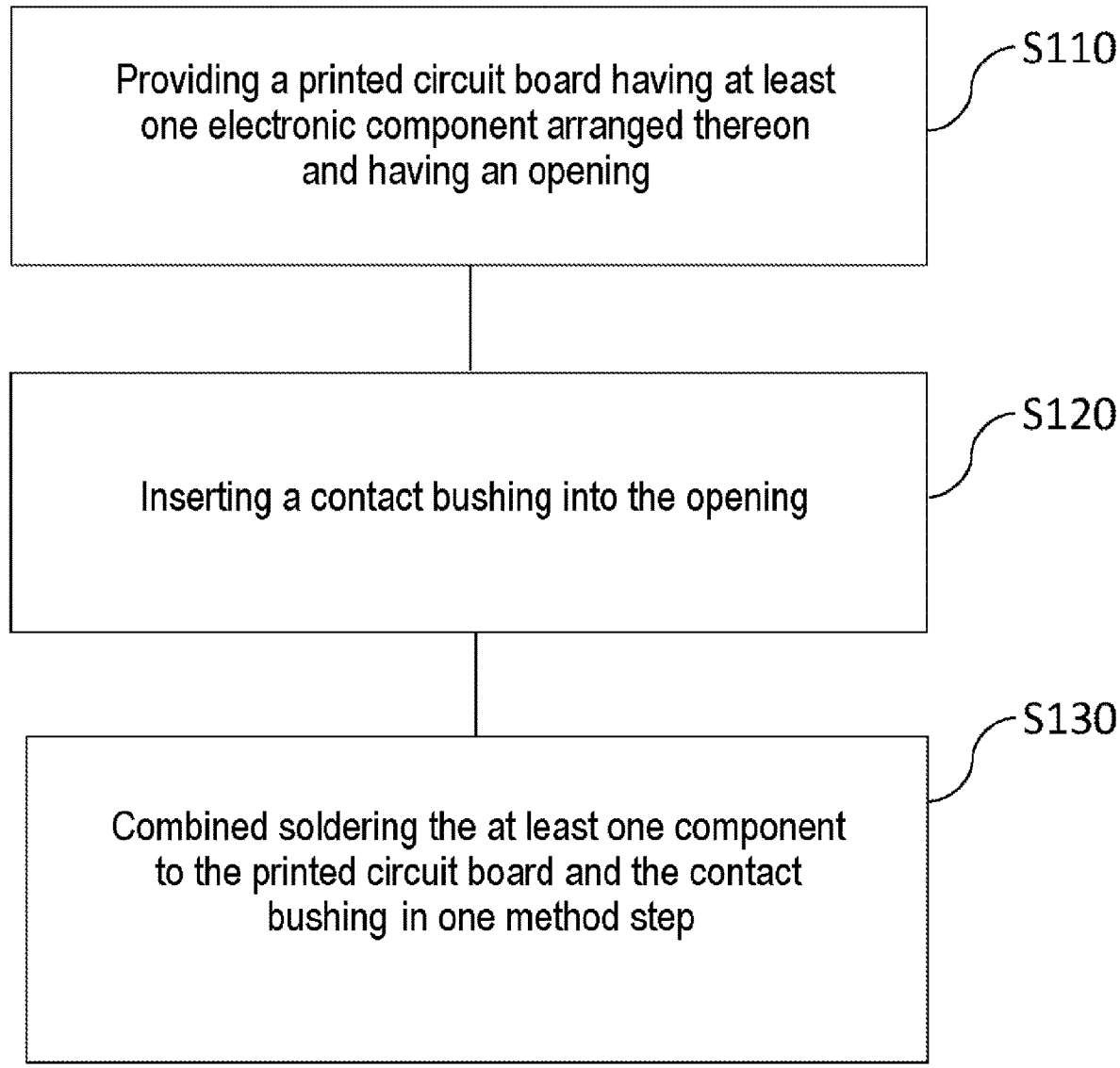
FIG. 1 illustrates a flow diagram for a method according to exemplary embodiments of the present invention.

FIG. 1 illustrates a flow diagram for a method according to exemplary embodiments of the present invention. The method comprises:
- providing S110 a printed circuit board having at least one electronic component arranged thereon and having (at least) one opening;
- inserting S120 a contact bushing into the opening; and
- combined soldering S130 the at least one component to the printed circuit board and to the contact bushing in one method step.

Figure 2:
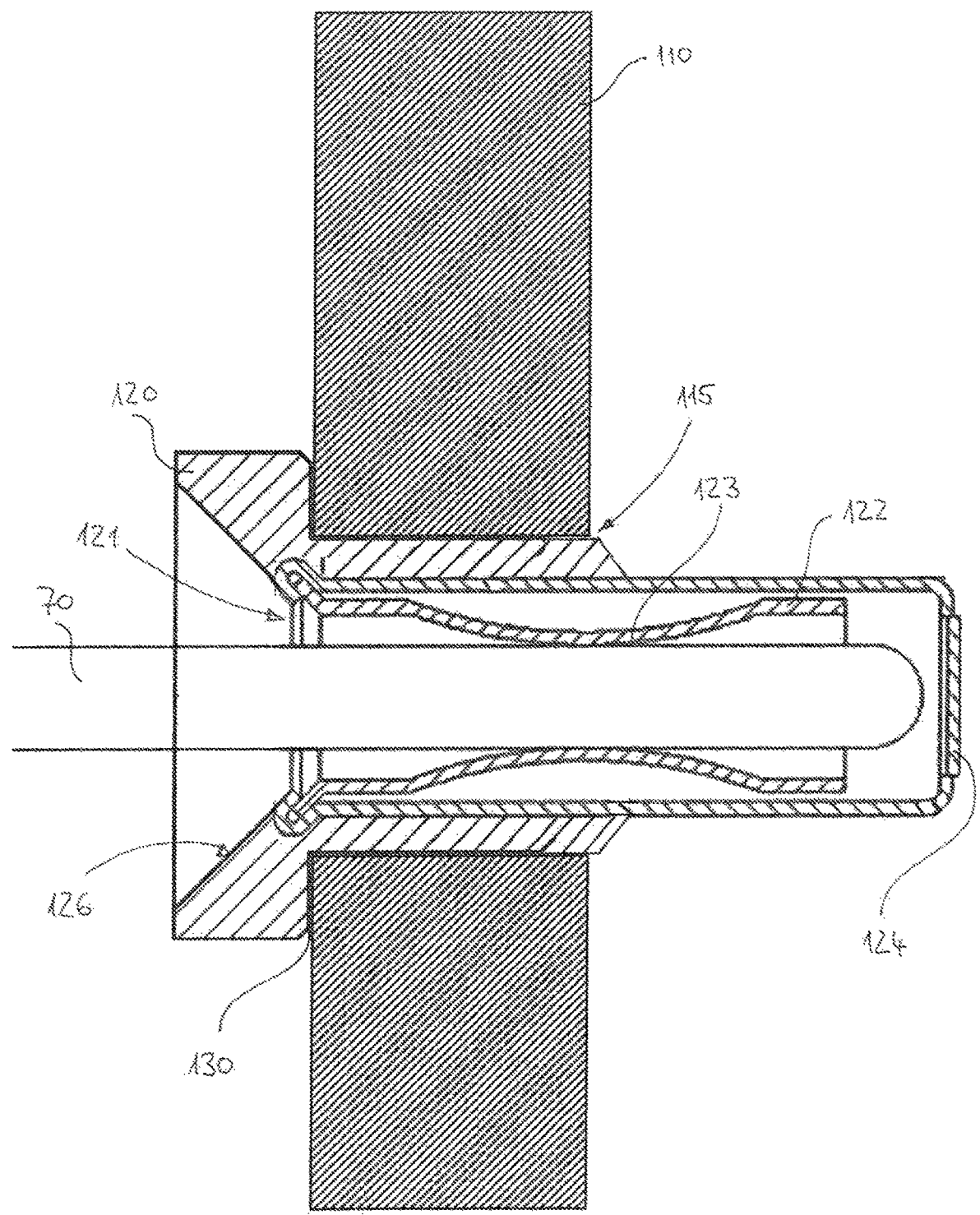
FIG. 2 illustrates for example a printed circuit board having a contact bushing that has been configured in accordance with the exemplary embodiments on the printed circuit board.

FIG. 2 illustrates for example a printed circuit board 110 having an opening 115 in which a contact bushing 120 is located. The contact bushing 120 comprises a through-going opening 121 having locking means 122 configured therein in order to fix a contact pin 70 and thus to produce a reliable electrical connection to a component (actuator, sensor, valve etc.). The locking means 122 can have for example flexibly designed arms 123 that deform as the contact pin 70 is inserted and hold the contact pin 70 in the contact bushing 120 by way of a pre-stressing force. The contact bushing 120 comprises also a funnel guide 126 in order to facilitate the procedure of inserting the contact pin 70 into the contact bushing 120. Furthermore, the contact bushing 120 comprises a covering 124 on the face of the contact bushing 120 that lies opposite the funnel guide 126 and the covering covers for example temporarily the through-going opening 121 with the result that the contact bushing 120 can be gripped for example by way of a vacuum suction method and can be automatically placed into the opening 115 of the printed circuit board 110. The covering 124 can be removed after the contact bushing 120 has been soldered onto the printed circuit board 110 with the result that the contact pin 70 can extend through the contact bushing 120.

In order to fix the contact bushing 120 in the opening 115 of the printed circuit board 110, it is possible to use a reflow soldering process that can be performed together with the SMD reflow process (SMD=surface mounted devices) and produce the reflow solder connection 130. The reflow solder connection 130 produces an electrical contact between the contact bushing 120, which is embodied for example from metal, and a metallization of the printed circuit board 110, with the result that the sensor or the actuator can be electrically connected by way of the contact pin 70 to the components on the printed circuit board 110. In order to perform the reflow soldering process, the printed circuit board 110 can have on both sides a corresponding solder material that liquefies during the reflow soldering process in order to produce the reflow solder connection 130 between the printed circuit board 110 and the contact bushing 120 or to the components. For example, a ca. 5 µm thick tin layer can be configured for this purpose on the printed circuit board 110 around the opening 115 and this thick tin layer can then later produce the electrical contact 130 to the contact bushing 120. The reflow soldering process for the contact bushing 120 consequently replaces the additional spring contact to the printed circuit board in the guide strip as is used in the case of conventional contacting methods. It is likewise possible that the contact bushing 120 is inserted into the opening 115 by means of a placement machine in an automated SMT assembly procedure (SMT=surface-mount technology).

The opening 115 can comprise for example a diameter of 2 to 4 mm or of ca. 2.8 mm. The through-going opening 121 within the contact bushing 120 can comprise for example a diameter between 2 ... 3 mm or of ca. 2.5 mm and the contact pins 70 can have a diameter of ca. 1 ... 2 mm. Moreover, a contact pad can be configured around the opening 115 (on one side or on both sides of the printed circuit board 110) and this contact pad can extend around the opening 115 in a width of ca. 5 mm and have the corresponding solder material (e.g. a 5 µm thick layer of tin).

Figure 3:
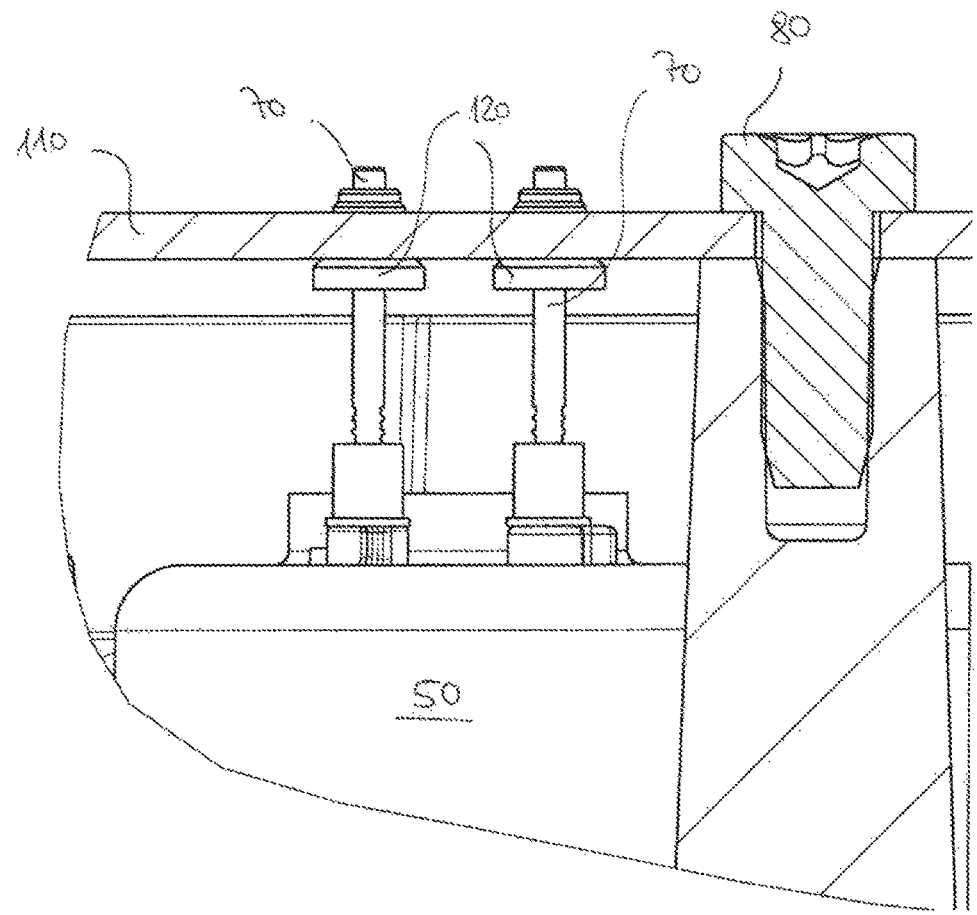
FIG. 3 illustrates for example the printed circuit board having the contact bushing that renders it possible to produce an electrical contact to a sensor/actuator by way of contact pins.

FIG. 3 illustrates for example the printed circuit board 110 that by way of the contact pins 70 produces an electrical contact to a sensor/actuator 50. The printed circuit board 110 is securely screwed, for example by means of attachment screws 80, in the commercial vehicle (e.g. in a control unit) at the position of the actuator or sensor 50. The mechanical attachment can also be realized by means of a press-in technology in lieu of attachment screws 80. The contact pin 70 can therefore not slip out independently. The locking means 122 in the contact bushing 120 consequently do not need to prevent the contact pin sliding out but rather above all need to ensure the electrical contact. This can be achieved by means of a corresponding spring force of the contact fingers 123. The printed circuit board 110 comprises electronic components that are not illustrated in FIG. 2 or FIG. 3. They illustrate for example a control procedure of the actuator or sensor 50 or comprise an evaluating unit.

A great advantage of exemplary embodiments is that only one soldering process is required to attach the electronic components to the printed circuit board 110 and to configure the contact between the contact connection and the sensor or the actuator 50. Moreover, the bushing 120 can be inserted automatically, for example by way of a placement machine, wherein for example a vacuum suction method can be used. The contact bushing 120 can have for example locking means 122 that can have by means of a press-in/clamping connection for the contact pin(s) 70 to the sensor and/or the actuator.

The features of the invention that are disclosed in the description, the claims and the figures can be essential both individually and also in any combination for the implementation of the invention.

THE LIST OF REFERENCE NUMERALS IS AS FOLLOWS

50 Actuator, sensor, . . .
70 Contact pin(s)
80 Attachment screws
110 Printed circuit board
115 Openings of the printed circuit board
120 Connection bushing
121 Through-going opening
122 Locking means
123 Deformable fingers
124 Rear-face, temporary covering
126 Funnel guide
130 Reflow solder connection

The invention claimed is:

1. A method for producing a connection contact for a sensor or an actuator of a vehicle, the method comprising:
   providing a printed circuit board having at least one electronic component arranged thereon and having an opening;
   inserting a contact bushing into the opening; and
   combined soldering the at least one component to the printed circuit board and the contact bushing to the printed circuit board in one task.

2. The method of claim 1, wherein the combined soldering process is a reflow soldering process.

3. The method of claim 1, wherein the sensor or the actuator can be electrically contacted by a contact pin, and wherein the inserting of the contact bushing is performed by a placement machine and the inserted contact bushing has a locking device for the contact pin.

4. The method of claim 3, wherein the locking device is configured in the inserted contact bushing to hold the contact pin by press-in technology.

5. The method of claim 3, wherein the contact bushing is inserted by a placement machine so that the placement machine grips the contact bushing by a vacuum and inserts it into the opening.

6. The method of claim 5, wherein the contact bushing has a through-going opening having a temporary covering, which is embodied from paper, so that the contact bushing is grippable by a vacuum, and wherein the temporary covering is removed after the combined soldering process has been performed.

7. The method of claim 1, wherein the printed circuit board has on both sides a soldering arrangement at the opening.

8. A circuit board having a connection contact for a sensor or for an actuator in a vehicle, comprising:
   a contact bushing having a through-going opening to receive a contact pin that contacts the sensor or the actuator of the vehicle and to provide an electrical contact; and
   a reflow solder connection between the contact bushing and a metallization of the printed circuit board and further reflow solder connections between one or more components and the printed circuit board.

9. The circuit board of claim 8, wherein the contact bushing has a through-going opening having a temporary covering, which is embodied from a paper material, wherein the temporary covering is configured so that the contact bushing is grippable by a placement machine by a vacuum.

10. A vehicle control unit, comprising:
    a printed circuit board having a connection contact for a sensor or for an actuator in a vehicle, including:
      a contact bushing having a through-going opening to receive a contact pin that contacts the sensor or the actuator of the vehicle and to provide an electrical contact; and
      a reflow solder connection between the contact bushing and a metallization of the printed circuit board and further reflow solder connections between one or more components and the printed circuit board;
    a sensor or an actuator; and
    at least one contact pin that provides an electrical connection between the printed circuit board and the sensor or the actuator.

* * * * *